United States Patent [19]
Rosen et al.

[11] Patent Number: 4,958,361
[45] Date of Patent: Sep. 18, 1990

[54] EDGE EFFECT REDUCTION BY SMOOTHING IN DIGITAL RECEIVERS

[75] Inventors: Robert A. Rosen, Santa Monica; Kapriel A. Krikorian, Los Angeles, both of Calif.

[73] Assignee: Hughes Aircraft Company, Los Angeles, Calif.

[21] Appl. No.: 185,018

[22] Filed: Apr. 22, 1988

[51] Int. Cl.⁵ .............................................. H03K 5/01
[52] U.S. Cl. .................................... 375/102; 326/163; 375/103
[58] Field of Search ................... 375/99, 102, 103, 59, 375/60, 72, 12; 455/296, 303, 304, 305, 312, 43, 114; 342/195, 196, 202, 204, 175, 192; 328/162, 163; 364/576, 726, 486, 574; 307/517; 367/38, 40, 47; 382/22; 358/39, 464

[56] References Cited

U.S. PATENT DOCUMENTS

| | | |
|---|---|---|
| 3,938,050 | 2/1976 | Corbett et al. ........................ 328/163 |
| 4,358,788 | 11/1982 | Burrowes ................................ 358/39 |
| 4,410,955 | 10/1983 | Burke et al. ........................... 375/60 |
| 4,601,005 | 7/1986 | Kilvington ........................... 364/726 |
| 4,780,623 | 10/1988 | Yagi ..................................... 328/163 |

Primary Examiner—Benedict V. Safourek
Attorney, Agent, or Firm—Leonard A. Alkov; Wanda K. Denson-Low

[57] ABSTRACT

A method for reducing interchannel noise or spectral splatter in fast fourier transform processing of digital data. Data is buffered and processed along two paths. During processing along the first path, a sharp discontinous edge is detected. Weights are applied to data samples around the edge to smooth the discontinuity. When the edge is processed by fourier transform methods, the sharp edge no longer causes broad band interchannel noise.

20 Claims, 3 Drawing Sheets

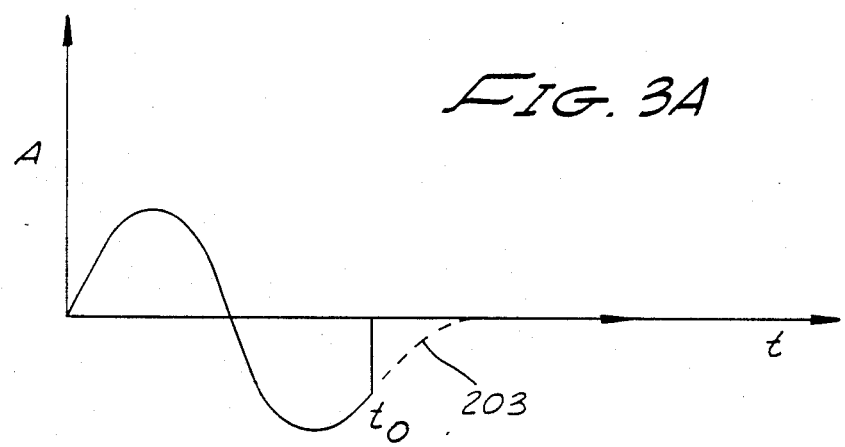
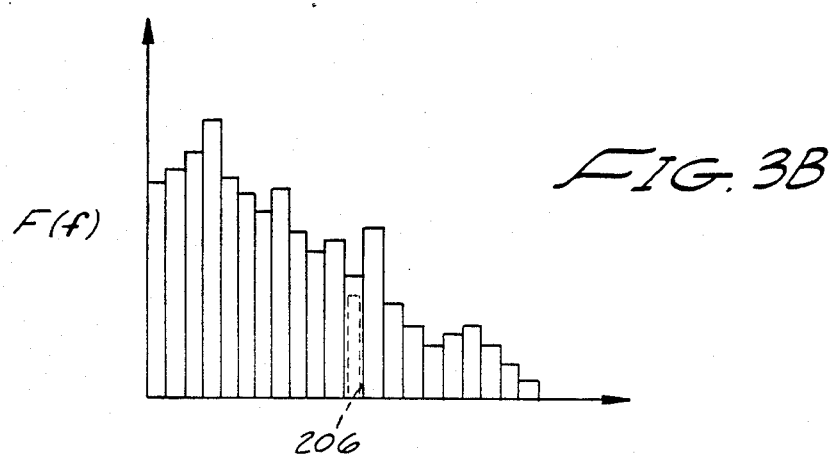
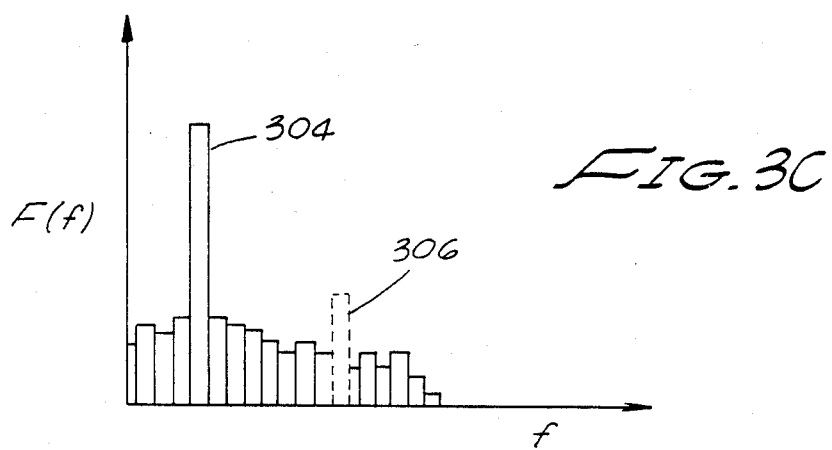

EDGE EFFECT REDUCTION BY SMOOTHING IN DIGITAL RECEIVERS

BACKGROUND OF THE INVENTION

1. Field of the Invention

This invention relates to methods and apparatus for improved detection, analysis, and discrimination of signals in receiving devices. In particular, these methods and apparatus reduce the undesirable effects of sharp signal pulses, called edges from strong signal emitters, allowing for greater dynamic ranges in detection.

2. Background of the Invention

Devices which receive and analyze a plurality of incoming signals through one or more detectors often process these signals to determine the number, direction, and strengths of various signal emitters within their vicinity. Radar and sonar receivers provide good examples of such detection devices. These receivers seek to locate and identify all emitters in their area, including both strong and weak signal sources. However, certain obstacles prevent precise and complete tracking. In particular, signals which turn suddenly on or off during reception and processing tend to drown out weaker signals, making their detection and discrimination much more difficult.

Many signal detection devices rely upon spectral analysis to identify and discriminate among a plurality of radar, sonar, or other electromagnetic signal sources. For data in digital form, special analysis through the use of a Fast Fourier Transform (FFT) yields the frequency spectrum which a particular signal source emits, effectively tagging individual sources by their frequencies. Fourier theory shows that any arbitrary signal or function, in this case a function of time, namely an electromagnetic wave, can be broken down or decomposed into a sum of individual sine waves of differing frequency.

The results of an FFT are often expressed in a power spectrum chart, graphing the amplitude weighting for each fourier sine wave component as a function of that component's frequency (sometimes called frequency bin or an FFT "filter"). One can reconstruct the original repeating signal function by multiplying each sine wave by its amplitude in the power spectrum and adding the resulting products. An FFT of a simple sine wave yields a single amplitude point on a power spectrum, at exactly that frequency. For an arbitrary signal in time, the power spectrum will generally be more complex, but will have a peak centered on the emitter's principal frequency.

Fourier transform theory assumes that the signal being analyzed has been "on" forever. If a signal that appears to be a clean repeating sine wave suddenly turns off or on during an FFT analysis, the power spectrum no longer provides a simple answer for the emitter frequency. This sudden turning on or off during transmission defines a signal "edge". The power spectrum of an edge no longer yields a peak for a single frequency. Instead, one requires an infinite number of sine wave frequencies to reconstruct the sudden discontinuity in the repeating wave. Hence, a power spectrum of an edge gives rather large amplitudes for a continuum of temporal frequencies. This broadened power spectrum constitutes a "special splatter" for the signal being analyzed. Such frequency or spectral splatter impairs detection of weaker radar signals, simply because the frequency components of the edge drown out a signal of weaker frequency. No method or apparatus has been available to reduce the spectral splatter of an edge, while still detecting the primary frequency of the strong emitter and also detecting the frequency of weaker signals.

SUMMARY OF THE INVENTION

This invention provides methods and apparatus for reducing spectral splatter produced in a digital receiver due to receiving edges from strong signal emitters. These apparatus include means for digitizing and buffering incoming signal data. In preferred embodiments, this data includes a plurality of signals of different frequency and comprising complex-valued numbers. Along a separate path, these apparatus provide means for ascertaining the presence of one or more edges in the same digitized data. If an edge occurs, special values or sets of weights are applied to the buffered data which smooth out the discontinuity in the edge. When the smoothed out edge is processed by the spectral analysis Fast Fourier Transform (FFT) stage, special splatter is reduced or eliminated. The result is that the frequency spread casued by the edge is quenched, and the signal-to-noise ratios for signals of other, and especially weaker, frequencies are increased. In other words, the strong edge and spectral splatter associated with a signal of a given frequency no longer drowns out weaker signals at other frequencies.

DESCRIPTION OF THE DRAWINGS

The invention may be better understood through reference to the following figures:

FIGS. 3A, 3B, and 3C show graphs of a strong signal over time with a pulse edge and the corresponding Fourier power spectrums both with and without edge smoothing.

DESCRIPTION OF A PREFERRED EMBODIMENT

Figure 1:
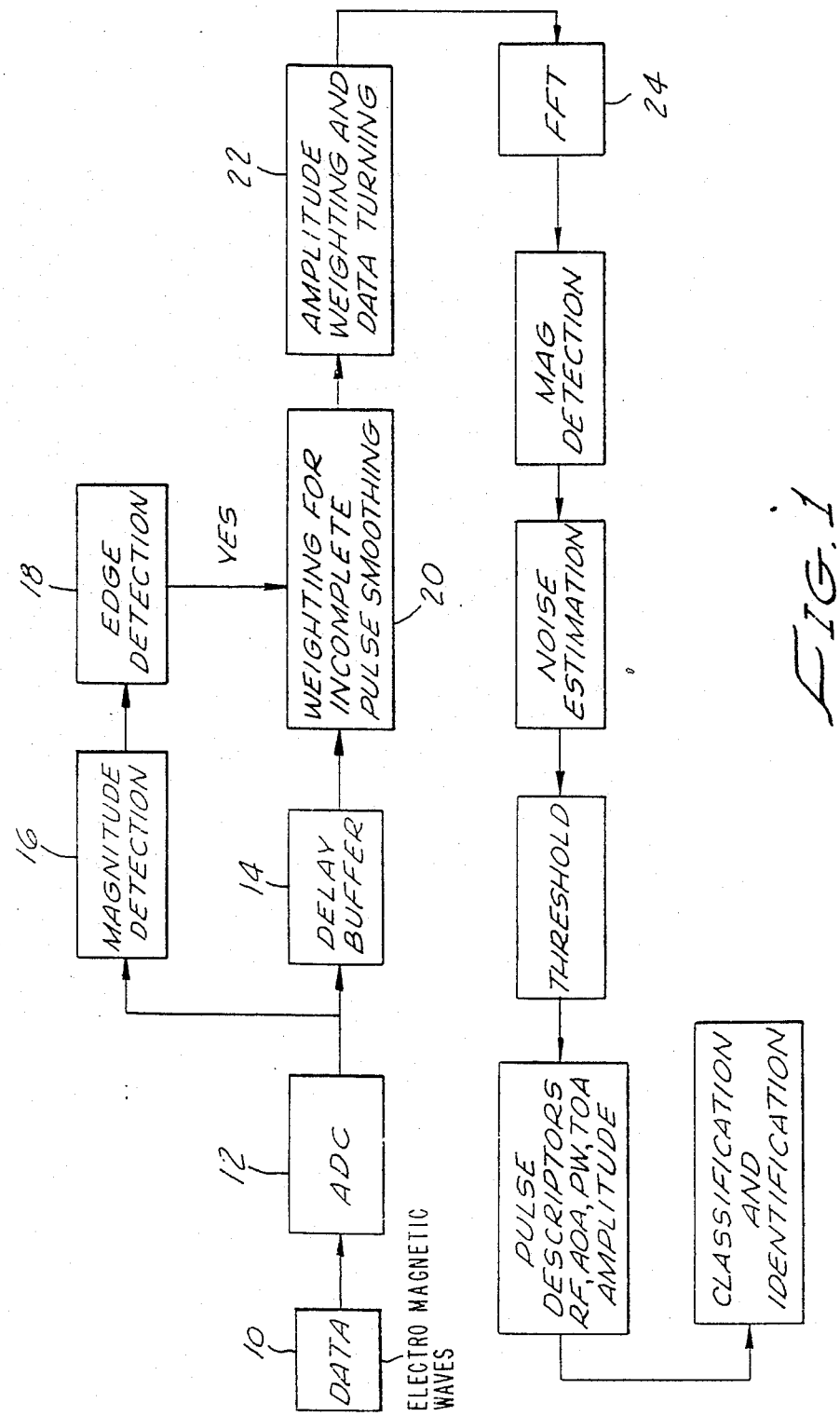
FIG. 1 represents a block diagram of the flow of data in the present invention.

FIG. 1 shows a block diagram for a digital radar receiver. The Analog-Digital Conversion (ADC) Block 12 receives and converts analog data 10 to digital information. The data is duplicated after this point, with one set of data delayed in a buffer 14 while the other set travels through the Edge Detection processing blocks 16 and 18. Within this path, the Magnitude Detection Block 16 forms real magnitudes out of the ADC complex number outputs, for use in recognizing edges. The real magnitude may be formed from the complex numbers in an approximate way, by taking (if the data is given by $a+bi$) the real value as $\text{Max}[|a|,|b|] + \frac{1}{2} \text{Min}[|a|,|b|]$, in order to save processing time. The real magnitude values for each signal are then sent to the Edge Detection block 18.

The Edge Detection Block 18 determines whether an edge is present or not. It performs this function in two stages. First, for each point j in the signal or data stream, clusters of data points located at some time n before the point are subtracted from clusters of data points located at some time n after the point. Thus, if some discontinuity should occur, subtracting points before and after the discontinuity would yield an offset.

After taking the positive value of the offset $b_j$ for the given point, it is compared with the offset values immediately before ($b_{j-1}$) and immediately after ($b_{j+1}$) the point in question. If the offset is larger than either of its neighbor and is larger than a threshold determined from the data itself, then an edge is declared at point j.

In the Edge Detection Block 18, if individual input amplitude magnitudes are given $a_j$, where j denotes the sequential order of the pulses and hence their time of arrival, then weighted offset values $b_j$ can be calculated as follows:

$$b_j = \left| \sum_{i=-m}^{m} a_{j+n+i} - \sum_{i=-m}^{m} a_{j-n+i} \right|$$

The summation bounds m and the offset n can be determined for the particular applications to yield the most efficient (i.e. process timesaving) and accurate algorithm required. The resulting weighted values $b_j$ for each data point j can be used to detect a pulse edge.

As described, a pulse edge is declared if $b_j > b_{j+1}$ and $b_j > b_{j-1}$ and $b_j > t_j$, i.e. if $b_j$ is greater than its nearest neighbors and is greater than some threshold value determined by $$t_j = S * Min \left[ \sum_{i=-m}^{m} a_{j+n+i}, \sum_{i=-m}^{m} a_{j-n+i} \right]$$

where parameter S determines the relative sensitivity for thresholding sharp edges. "Min" refers to taking the value of the minimum of the arguments within the brackets. Configuring the parameters used in the algorithms requires testing sample data and varying the parameters, m,n, and S until the best results are obtained, best meaning the lowest overall frequency noise from sharp edges. The algorithm described for determining the $b_j$'s and for declaring pulse edges is just one example of various processing alternatives.

As a processing time saver, the partial summation results used for every jth data point as shown above can be kept in memory and updated easily for each incoming data point by adding and subtracting the data points in a buffer. This partial summing can save processing time.

Once the Edge Detection Block 18 determines an edge through the above procedure, it sends an instruction to the Pulse Smoothing block 20 to apply the smoothing weights to the data's edge. Using one method, the weights are applied by multiplying a set number of the samples around the edge at sample j by a fixed weight set centered on data sample j.

The weighting algorithm can be varied for specific system goals, requiring a tailoring of the weights to the particular data, their dynamic range, and to the FFT algorithms being used. As a preferred embodiment, the weighting used is represented by $W_s(t)$, given by:

$$W_s(t) = \begin{bmatrix} 0.5 & (1 - \cos[2/N * f_s (t - \tau)]) \\ & \text{for } |f_s(t - \tau)| < N/2 \\ 1.0 & \text{elsewhere} \end{bmatrix}$$

where $f_s$ is the data sampling rate and N is the number of samples weighted. $\tau$ is the pulse rise time. Alternatively, the weighting used for sample i, for example, is represented by $W_i$, given by:

$$W_i = \begin{bmatrix} 0.5 & (1 - \cos[2\pi/N * (i - j)]) \\ & \text{for } i - j < N/2 \\ 1.0 & \text{elsewhere} \end{bmatrix}$$

where N is the number of samples weighted, and j is the sample index of a pulse edge as set forth above. The smoothing of the sharp discontinuity, or edge, reduces the spectral splatter or interchannel noise in the resulting power spectrum as described before.

After any necessary edge-smoothing weights are applied to the edges, normal pre-FFt amplitude weights 22 are applied (for example Dolph-Chebyshev weights) which reduce sidelobes for the FFT being used. An FFT normally processes a set number of data points at a time, the number of data points used being called the "window". If the FFT window doesn't quite match the weighted data stream, some data turning 22 may be required to properly match the weighted sample size to the FFT window. As an alternative to the edge smoothing approach described, a whole collection of possible weights could be preset and used depending on the location of the edge within the FFT processing window. This can save processing time by calculating in advance all possible weighting combinations. In a further variation of this approach, the edge smoothing weights and the single set of amplitude (Dolph-Chebyshev) weights are replaced by a group of combined weights, each pre-optimized for a particular location of the pulse edge within the FFT processing window.

The two approaches discussed have benefits and drawbacks. The first approach, multiplying when detected each edge by the weights, has the greater flexibility. Any number of edges within a given window can be smoothed, and modularity allows different post-processing to be done without reprogramming or restructuring the smoothing step. The second approach, having preset weighting sets, implements the edge smoothing into a total processing system, trading flexibility for processing speed and pre-optimization.

After the spectral analysis FFT step represented by block 24 is performed, magnitude detection, noise estimation, thresholding, derivation of pulse descriptors, and the final emitter classification and identifications are made.

Magnitude detection, after the FFT is performed, determines the strengths of each frequency given in the filters of the FFT. Each filter bin represents a possible signal and its relative strength determines how likely it is an actual signal from an existing emitter. The noise estimation stage determines the noise level of all the filter bins in order to form a reasonable thresholding value for removing noise from true signals. The removal process is performed at the thresholding stage, using the threshold already determined.

Once a collection of signals is obtained, the pulse descriptor stage calculates the angle and times of arrival of given frequency signals, their pulse widths and their amplitudes or strengths. Determining the angle of an emitter often requires a plurality of antennas or detectors to triangulate the signal source. On the basis of these descriptors, time histories of pulses are created in the classification and identification stage, so that received pulses are correlated with emitters and these emitters may be tracked in time.

Figure 2A:
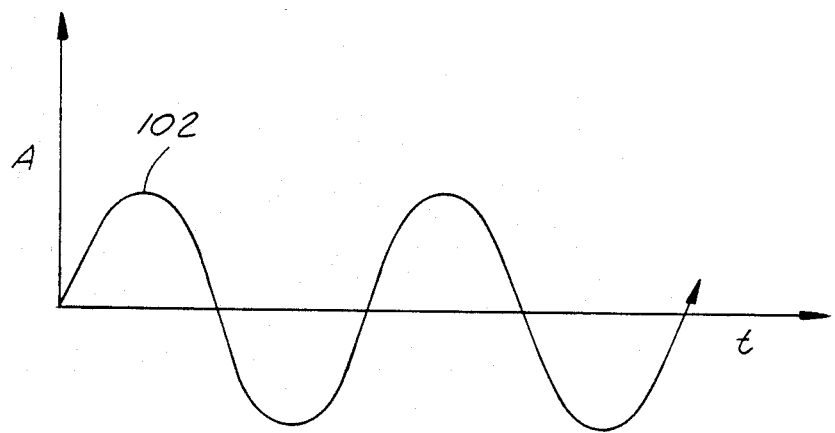
FIGS. 2A and 2B show graphs of a strong signal over time and its corresponding Fourier power spectrum, with a superimposed weaker signal.
Figure 2B:
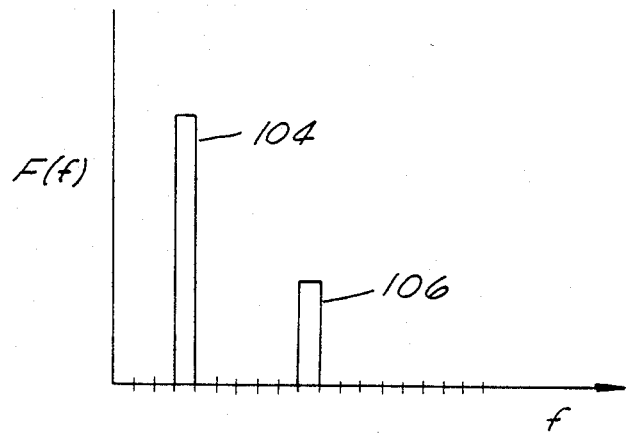

FIGS. 2 and 3 illustrate a simple operation of the present invention. FIG. 2A reveals a strong signal sine wave 102, graphed with its amplitude A over time t. FIG. 2B shows the power spectrum resulting from performing an FFT upon the strong signal. F(f) represents the relative strength of the incoming signals versus frequency. The tall bin 104 is the amplitude of the strong signal; smaller bin 106 represents a relatively weak signal detected along with the stronger signal. In this case, both signals are easy to detect and distinguish from one another.

FIG. 3A represents the same strong signal 202 as FIG. 2A but here the signal suddenly cuts off at time t designated t$_0$. A dashed line 203 indicates the smoothing of the discontinuity which the present invention provides. FIG. 3B shows a power spectrum of the strong signal and its edge without any smoothing, having every FFT filter or bin excited. The noise or spectral splatter resulting from the signal edge washes out the small signal 206 shown by the dotted lines. FIG. 3C shows the power spectrum resulting after edge smoothing, the noise being much smaller in strength. One clearly discerns the strong frequency 304 as well as the weaker frequency signal 306. Edge smoothing greatly reduces the FFT noise or spectral splatter, allowing detection of smaller signals and thereby increasing the dynamic range for detection.

What is claimed is:

1. A method for reducing spectral splatter in a signal processor comprising:
    processing digital data along two paths;
    along the first of said two paths determining when said data comprises an edge; and
    when said edge is determined in said first path, applying weights to said edge in said second path, said weights, when applied to said edge, tending to reduce said spectral splatter and tending to limit said edge to a narrow bandwidth when the weighted edge is spectrally analyzed.

2. A method for reducing spectral splatter in a signal receiver comprising the steps of:
    receiving signal data in digital form;
    processing said data along two paths;
    along the first of said paths, converting said digital data to real-valued data;
    determining when a series of said real-valued data comprise an edge;
    along the second of said paths, delay buffering said digital data;
    along the second of said paths, determining the weighting values for applying to said detected edges; and
    in said second of said paths, applying said weighting values to said detected edges while said digital data traverses said second path, said weighting values, when applied to said edge, tending to reduce said spectral splatter and tending to limit said edge to a narrow bandwidth.

3. A method for reducing spectral splatter as claimed in claim 2 further comprising:
    selecting said weighting values so as to reduce said spectral splatter when said data is spectrally analyzed.

4. Method as claimed in claim 2 further comprising receiving signals comprising electromagnetic waves.

5. Method as claimed in claim 2 further comprising converting received analog signal data into digital form.

6. Method as claimed in claim 2 further comprising processing said weighted data by performing a Fast Fourier Transform.

7. Method as claimed in claim 2 wherein determining when a series of said real-valued data comprise an edge includes:
    calculating $b_j$'s from said real-valued data labeled $a_j$; and
    determining when one of said $b_j$'s is greater than its two nearest neighbors, $b_{j-1}$ and $b_{j+1}$, and is greater than a threshold value $t_j$ such that $a_j$ comprises an edge, wherein $b_j$ is the weighted offset value at data point $j$ for which an edge test is performed, and $a_j$ is the magnitude of the data at point j.

8. Method as claimed in claim 7 wherein calculating $b_j$ includes:
    calculating a first sum of $2m+1$ said $a_j$'s around $a_{j+n}$;
    calculating a second sum of $2m+1$ said $a_j$'s around $a_{j-n}$; and
    subtracting said second sum from said first sum, wherein m is defined as the summation bound for calculated weighted offset values $b_j$.

9. Method as claimed in claim 7 further comprising forming a threshold value $t_j$ by:
    calculating a first sum of $2m+1$ said $a_j$'s around $a_{j+n}$;
    calculating a second sum of $2m+1$ said $a_j$'s around $a_{j-n}$; and
    letting $t_j$ equal a number S times the minimum of said first sum of said second sum, wherein m is defined as the summation bound for calculated weighted offset values $b_j$, n is defined as an offset value, and S is defined as the relative sensitivity for thresholding said edge.

10. An apparatus for reducing spectral splatter in a signal receiver comprising:
    means for receiving signal data in digital form;
    means for converting said data into real-valued data;
    means for determining when a series of said real-valued data comprise an edge;
    means for delaying a second set of said signal data until said converting means and said determining means have finished processing said signal data; and
    means for applying weighting values to said edges in said second set of said signal data, said weighting values tending to reduce said spectral splatter and tending to limit said edge to a narrow bandwidth.

11. Apparatus as claimed in claim 10 wherein said signal comprises an electromagnetic wave.

12. Apparatus as claimed in claim 10 wherein said means for receiving signal data comprises an analog to digital converter.

13. Apparatus as claimed in claim 10 wherein said weighting values reduce said spectral splatter when said data with said weighting values applied to each of said edges is processed.

14. Apparatus as claimed in claim 10 further comprising means for processing said weighted signal data, and wherein said means for processing said weighted signal data comprises a Fast Fourier Transform.

15. A method for reducing spectral splatter in a signal receiver comprising the steps of:
receiving signal data in digital form; processing said data along two paths; along the first of said two paths, converting said digital data to real-value data;
determining when a series of said real-value data comprise an edge including calculation $b_j$'s from said real-value data labeled $a_j$; and determining when one of said $b_j$'s is greater than its two nearest neighbors $b_j-1$ and $b_j+1$, and is greater than a threshold value $t_j$ such that $a_j$ comprises an edge, wherein $b_j$ is the weighted offset value at data point $j$ for which an edge test is performed, $a_j$ is the magnitude of the data at point $j$, and $j$ is a point in the data at which an edge appears; along the second of said paths, delay buffering said digital data; determining weighting values for applying to said detected edges; and, in the second of said paths, applying said weighting values to said detected edges while said digital data traverses said second path.

16. The method of claim 15 wherein calculating $b_j$ includes:
calculating a first sum of $2m+1$ said $a_j$'s around $a_{j+n}$;
calculating a second sum of $2m+1$ said $a_j$'s around $a_{j-n}$; and
subtracting said second sum from said first sum, wherein m is defined as the summation bound for calculated weighted offset values $b_j$.

17. The method of claim 15 further comprising forming a threshold value $t_j$ by:
calculating a first sum of $2m+1$ said $a_j$'s around $a_{j+n}$;
calculating a second sum of $2m+1$ said $a_j$'s around $a_{j-n}$; and
letting $t_j$ equal a number S times the minimum of said first sum and of said second sum, wherein m is defined as the summation bound for calculated weighted offset values $b_j$, n is defined as an offset value, and S is defined as the relative sensitivity for thresholding said edge.

18. An apparatus for reducing spectral splatter in a signal receiver comprising:
means for receiving signal data in digital form;
means for converting said data into real-valued data;
means for determining when a series of said real-valued data comprise an edge, including:
means for calculating $b_j$'s from said real-valued data labeled $a_j$;
means for determining when one of said $b_j$'s is greater than its two nearest neighbors $b_j-1$ and $b_j+1$, and is greater than a threshold value $t_j$ such that $a_j$ comprises an edge, wherein $b_j$ is the weighted offset value at data point $j$ for which an edge test is performed, $a_j$ is magnitude of the data at point $j$, and $j$ is a point in the data at which an edge appears; and
means for applying weighting values to said edges of said signal data.

19. The apparatus of claim 18 further comprising means for calculating $b_j$ including means for calculating a first sum of $2m+1$ said $a_j$'s around $a_{j+n}$;
means for calculating a second sum of $2m+1$ said $a_j$'s around $a_{j-n}$; and means for subtracting said second sum from said first sum, wherein m is defined as the summation bound for calculated weighted offset values $b_j$.

20. The apparatus of claim 19 further comprising means for forming a threshold value $t_j$ by:
calculating a first sum of $2m+1$ said $a_j$'s around $a_{j+n}$;
calculating a second sum of $2m+1$ said $a_j$'s around $a_{j-n}$; and
letting $t_j$ equal a number S times the minimum of said first sum and of said second sum, wherein m is defined as the summation bound for calculated weighted offset values $b_j$, n is defined as an offset value, and S is defined as the relative sensitivity for thresholding said edge.

* * * * *